United States Patent
Abe et al.

(10) Patent No.: US 10,611,959 B2
(45) Date of Patent: Apr. 7, 2020

(54) PHOSPHOR AND LIGHT EMITTING DEVICE

(71) Applicant: Panasonic Intellectual Property Management Co., Ltd., Osaka (JP)

(72) Inventors: Takeshi Abe, Osaka (JP); Shozo Oshio, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 16/326,191

(22) PCT Filed: Jul. 25, 2017

(86) PCT No.: PCT/JP2017/026779
§ 371 (c)(1),
(2) Date: Feb. 16, 2019

(87) PCT Pub. No.: WO2018/042949
PCT Pub. Date: Mar. 8, 2018

(65) Prior Publication Data
US 2019/0194538 A1    Jun. 27, 2019

(30) Foreign Application Priority Data

Aug. 29, 2016  (JP) .................. 2016-166944

(51) Int. Cl.
*H01J 1/63* (2006.01)
*C09K 11/77* (2006.01)
(Continued)

(52) U.S. Cl.
CPC ...... *C09K 11/7706* (2013.01); *C09K 11/7774* (2013.01); *H01L 33/502* (2013.01);
(Continued)

(58) Field of Classification Search
None
See application file for complete search history.

(56) References Cited

U.S. PATENT DOCUMENTS

| 8,350,465 B2 | 1/2013 | Winkler |
| 2005/0093442 A1* | 5/2005 | Setlur ............... C09K 11/7774 313/512 |

(Continued)

FOREIGN PATENT DOCUMENTS

| EP | 3428245 A1 | 1/2019 |
| JP | 3503139 B | 12/2003 |

(Continued)

OTHER PUBLICATIONS

Search Report dated Apr. 12, 2019 in the counterpart European patent application No. 17845958.2.

(Continued)

*Primary Examiner* — Ali Naraghi
(74) *Attorney, Agent, or Firm* — Renner, Otto, Boisselle & Sklar, LLP (57) ABSTRACT

A phosphor is a phosphor composed by containing $Ce^{3+}$ as an emission center in a matrix garnet compound having a garnet structure. Then, in the matrix garnet compound, a part of Ca that composes a crystal of $Lu_2CaMg_2(SiO_4)_3$ is replaced by Mg. Moreover, a light emitting device includes the above-mentioned phosphor. In this way, it is possible to provide a garnet phosphor in which temperature quenching is reduced without largely shifting the light emission peak wavelength from that of a $Lu_2CaMg_2(SiO_4)_3:Ce^{3+}$ phosphor, and to provide a light emitting device using the garnet phosphor.

4 Claims, 7 Drawing Sheets (51) Int. Cl.
    *H01L 33/50*   (2010.01)
    *H01S 5/00*    (2006.01)
    *H01S 5/40*      (2006.01)
    *H01S 5/323*     (2006.01)

(52) U.S. Cl.
    CPC ............ *H01S 5/005* (2013.01); *H01L 33/505* (2013.01); *H01L 33/507* (2013.01); *H01S 5/32341* (2013.01); *H01S 5/4087* (2013.01)

(56) References Cited

U.S. PATENT DOCUMENTS

| | | | | |
|---|---|---|---|---|
| 2009/0322209 | A1* | 12/2009 | Becker | C09K 11/7734 313/503 |
| 2011/0279022 | A1* | 11/2011 | Winkler | C09K 11/7774 313/504 |
| 2014/0084323 | A1 | 3/2014 | Shimizu | |
| 2014/0152173 | A1* | 6/2014 | Oshio | C09K 11/7774 313/503 |
| 2017/0058197 | A1* | 3/2017 | Nishimata | H01L 33/62 |

FOREIGN PATENT DOCUMENTS

| | | |
|---|---|---|
| JP | 2007-510040 A | 4/2007 |
| JP | 5611960 B | 9/2014 |

OTHER PUBLICATIONS

International Search Report for corresponding App. No. PCT/JP2017/026779, dated Aug. 29, 2017.
Written Opinion for corresponding App. No. PCT/JP2017/026779, dated Aug. 29, 2017.
M. Satya Kishore et al., Solid Solution Formation and Ce3+ Luminescence in Silicate Garnets, Electrochemical and Solid-State Letters, Apr. 6, 2010, 13/6, J77-J80.
Anant A. Setlur et al., Crystal Chemistry and Luminescence of Ce3+-Doped Lu2CaMg2(Si,Ge)3O12 and Its Use in LED Based Lighting, Chemistry of Materials, 2006, vol. 18, No. 14, pp. 3314-3322.
Anant A. Setlur et al., Blue Light-Emitting Diode Phosphors Based upon Oxide, Oxyhalide, and Halide Hosts, ECS Journal of Solid State Science and Technology, 2013, vol. 2, No. 2, pp. 3059-3070.

* cited by examiner

PHOSPHOR AND LIGHT EMITTING DEVICE

TECHNICAL FIELD

The present invention relates to a phosphor and a light emitting device. More specifically, the present invention relates to a novel garnet phosphor that is used together with a solid-state light emitting element such as a semiconductor laser diode (LD) and is widely usable as a phosphor to be used for a light source of a display device such as a projector or of a lighting device, and relates to a light emitting device using this phosphor.

BACKGROUND ART

Heretofore, compounds having a crystal structure called a "garnet structure" have been known. As one of the compounds having the garnet structure, a compound represented by $Y_3Al_2(AlO_4)_3$ has been known. This $Y_3Al_2(AlO_4)_3$ has been widely known by an abbreviation that is yttrium aluminum garnet (YAG). Then, $Y_3Al_2(AlO_4)_3$ has been widely used for a solid-state laser, translucent ceramics, a phosphor and the like.

Here, the phosphor is a compound that radiates fluorescence by being given a stimulation such as an ultraviolet ray. In the phosphor, when extranuclear electrons of specific atoms which compose the phosphor return to a ground state after being excited by the ultraviolet ray and the like, a difference in energy level between an excited state and the ground state is emitted as visible light. The phosphor is obtained, for example, by containing rare earth ions or transition metal ions ($Ce^{3+}$, $Tb^{3+}$, $Eu^{3+}$, $Mn^{2+}$, $Mn^{4+}$, $Fe^{3+}$, $Cr^{3+}$ or the like) as an emission center in such a compound as $Y_3Al_2(AlO_4)_3$ having the garnet structure.

Hereinafter, in this description, such a phosphor composed by containing the rare earth ions or the transition metal ions ($Ce^{3+}$, $Tb^{3+}$, $Eu^{3+}$, $Mn^{2+}$, $Mn^{4+}$, $Fe^{3+}$, $Cr^{3+}$ or the like) as the emission center in the compound having the garnet structure is also referred to as the garnet phosphor. Note that, in this description, the garnet phosphor is simply referred to as a phosphor in some cases. Moreover, the phosphor composed by containing the rare earth ions or the transition metal ions ($Ce^{3+}$, $Tb^{3+}$, $Eu^{3+}$, $Mn^{2+}$, $Mn^{4+}$, $Fe^{3+}$, $Cr^{3+}$ or the like) as the emission center in $Y_3Al_2(AlO_4)_3$ having the garnet structure is also referred to as a $Y_3Al_2(AlO_4)_3$ phosphor. Furthermore, for convenience, a $Y_3Al_2(AlO_4)_3$ phosphor containing at least $Ce^{3+}$ as an emission center is also referred to as a $Y_3Al_2(AlO_4)_3$:$Ce^{3+}$ phosphor.

It is known that the $Y_3Al_2(AlO_4)_3$:$Ce^{3+}$ phosphor is excited when being irradiated with a particle beam or an electromagnetic wave, such as an electron beam, a vacuum ultraviolet ray and blue light, and radiates yellow green visible light. Moreover, it is also known that the $Y_3Al_2(AlO_4)_3$:$Ce^{3+}$ phosphor has a $1/10$ afterglow time as extremely short as 100 ns or less. Therefore, the $Y_3Al_2(AlO_4)_3$:$Ce^{3+}$ phosphor is widely used for a large number of light emitting devices.

As described above, a light color of the light radiated by the $Y_3Al_2(AlO_4)_3$:$Ce^{3+}$ phosphor is yellow green. It is known that, in contrast, when a part or all of elements which compose the $Y_3Al_2(AlO_4)_3$:$Ce^{3+}$ phosphor are replaced by another element different in ionic radius, a phosphor that radiates a different light color from that of the $Y_3Al_2(AlO_4)_3$:$Ce^{3+}$ phosphor is obtained.

For example, Patent literatures 1 and 2 disclose a garnet phosphor that radiates a light color with a longer wavelength than that of the $Y_3Al_2(AlO_4)_3$:$Ce^{3+}$ phosphor. Patent literature 1 discloses a $(Y,Gd)_3Al_2(AlO_4)_3$:$Ce^{3+}$ phosphor obtained by replacing a part of Y that composes the $Y_3Al_2(AlO_4)_3$:$Ce^{3+}$ phosphor by gadolinium (Gd). The $(Y,Gd)_3Al_2(AlO_4)_3$:$Ce^{3+}$ phosphor radiates yellow green to orange visible light, and is widely known as a garnet phosphor that radiates a light color with a longer wavelength than that of the $Y_3Al_2(AlO_4)_3$:$Ce^{3+}$ phosphor.

However, it is known that temperature quenching of the $(Y,Gd)_3Al_2(AlO_4)_3$:$Ce^{3+}$ phosphor is increased as the wavelength of the light color to be radiated thereby is increased. In particular, light emission efficiency of the $(Y,Gd)_3Al_2(AlO_4)_3$:$Ce^{3+}$ phosphor with a light emission peak wavelength of 585 nm or more does not reach a practical level thereof. Herein, the temperature quenching is a phenomenon that light emission efficiency decreases as a temperature of the phosphor rises.

Patent literature 2 discloses a $Y_3Mg_2(SiO_4)_2(AlO_4)$:$Ce^{3+}$ phosphor obtained by replacing aluminum (Al) that composes the $Y_3Al_2(AlO_4)_3$:$Ce^{3+}$ phosphor by magnesium (Mg) and further replacing a part of the $(AlO_4)$ group by a $(SiO_4)$ group. The $Y_3Mg_2(SiO_4)_2(AlO_4)$:$Ce^{3+}$ phosphor is known as a garnet phosphor that radiates orange to red visible light. However, it is known that temperature quenching of the $Y_3Mg_2(SiO_4)_2(AlO_4)$:$Ce^{3+}$ phosphor is also large, and light emission efficiency of the $Y_3Mg_2(SiO_4)_2(AlO_4)$:$Ce^{3+}$ phosphor does not reach a practical level thereof.

Meanwhile, other than the $(Y,Gd)_3Al_2(AlO_4)_3$:$Ce^{3+}$ phosphor and the $Y_3Mg_2(SiO_4)_2(AlO_4)$:$Ce^{3+}$ phosphor, a garnet phosphor that radiates the light color with a longer wavelength than that of the $Y_3Al_2(AlO_4)_3$:$Ce^{3+}$ phosphor is also known (for example, Patent literature 3, Non patent literature 1 and Non patent literature 2). This garnet phosphor is obtained by replacing yttrium (Y) by lutetium (Lu) and calcium (Ca), replacing aluminum (Al) by magnesium (Mg), and further, replacing the $(AlO_4)$ group by a $(SiO_4)$ group. The yttrium (Y), the aluminum (Al) and the $(AlO_4)$ group are components of the $Y_3Al_2(AlO_4)_3$:$Ce^{3+}$ phosphor. This phosphor is a phosphor represented by a general formula: $Lu_2CaMg_2(SiO_4)_3$:$Ce^{3+}$, and is known to radiate orange visible light and have relatively small temperature quenching.

CITATION LIST

Patent Literature

Patent Literature 1: Japanese Patent No. 3503139
Patent Literature 2: Japanese Patent No. 5611960
Patent Literature: 3: Japanese Unexamined Patent Application Publication No. 2007-510040

Non Patent Literature

Non Patent Literature 1: Anant A. Setlur and four others, "Chemistry of Materials", 2006, Vol. 18, No. 14, pp. 3314-3322
Non Patent Literature 2: Anant A. Setlur and four others, "ECS Journal of Solid State Science and Technology", 2013, Vol. 2, No. 2, pp. 3059-3070

SUMMARY OF INVENTION

However, when the $Lu_2CaMg_2(SiO_4)_3$:$Ce^{3+}$ phosphor is excited by a laser beam of a semiconductor laser diode or the like, the temperature quenching is a non-negligible problem.

Therefore, it has been necessary to further reduce the temperature quenching of the $Lu_2CaMg_2(SiO_4)_3:Ce^{3+}$ phosphor.

The present invention has been made in consideration of such a problem as described above, which is inherent in the prior art. It is an object of the present invention to provide a phosphor in which the temperature quenching is reduced without largely shifting a light emission peak wavelength from that of the $Lu_2CaMg_2(SiO_4)_3:Ce^{3+}$ phosphor, and to provide a light emitting device using the phosphor.

In order to solve the above problem, a phosphor includes: a matrix garnet compound having a garnet structure; and $Ce^{3+}$ as an emission center, which is contained in the matrix garnet compound. Then, in the matrix garnet compound, a part of Ca that composes crystals of $Lu_2CaMg_2(SiO_4)_3$ is replaced by Mg.

A light emitting device according to a second aspect of the present invention includes the phosphor according to the first aspect.

DESCRIPTION OF EMBODIMENTS

Hereinafter, a detailed description will be given of a phosphor according to this embodiment and a light emitting device using the phosphor. Note that dimensional ratios in the drawings are exaggerated for convenience of explanation, and are sometimes different from actual ratios.

[Phosphor]

The phosphor according to this embodiment is a phosphor composed by containing trivalent cerium ions ($Ce^{3+}$) as an emission center in a matrix garnet compound having a garnet structure. That is, the phosphor according to this embodiment has a garnet structure in a similar way to the matrix garnet compound, and accordingly, is a so-called garnet phosphor.

The matrix garnet compound is a compound that has the garnet structure and serves as a matrix of $Ce^{3+}$ as an emission center. Herein, the garnet structure is a crystal structure represented by $A_3B_2(CO_4)_3$ (where, A, B and C are elements). Then, in this embodiment, the matrix garnet compound is composed of a compound in which a part of calcium (Ca) that composes crystals of $Lu_2CaMg_2(SiO_4)_3$ is replaced by magnesium (Mg).

As mentioned above, the conventional phosphor having $Ce^{3+}$ as an emission center and $Lu_2CaMg_2(SiO_4)_3$ as a matrix radiates orange visible light, and originally, the temperature quenching thereof is relatively small. However, in the case of exciting this phosphor by a laser beam, the temperature quenching has been a non-negligible problem. In contrast, in the phosphor of this embodiment, a part of calcium that composes the crystals of $Lu_2CaMg_2(SiO_4)_3$ is replaced by magnesium that is an element homologous thereto. A mechanism in which such a partial replacement by the homologous element reduces the temperature quenching as described above is unknown as of now. However, a part of Ca is replaced by Mg while maintaining the garnet structure, whereby the temperature quenching can be suppressed even if the phosphor is excited by a laser beam.

Here, in general, there is a correlation between a light emission peak wavelength and the reduction of the temperature quenching. Frequently, as the temperature quenching is reduced, the light emission peak wavelength shifts largely to a short wavelength side. However, as in this embodiment, when a part of Ca in the $Lu_2CaMg_2(SiO_4)_3:Ce^{3+}$ phosphor is replaced by Mg while maintaining the garnet structure, it becomes possible to reduce the temperature quenching while suppressing the light emission peak wavelength from shifting to the short wavelength side.

In the phosphor of this embodiment, it is preferable that the matrix garnet compound be represented by a general formula (1):

$$Lu_2(Ca_{1-x}Mg_x)Mg_2(SiO_4)_3 \qquad (1)$$

In Formula (1), preferably, x is a numerical value that satisfies $0.03 \le x \le 0.3$. More preferably, x is a numerical value that satisfies $0.03 \le x \le 0.2$, still more preferably, x is a numerical value that satisfies $0.03 \le x \le 0.15$, particularly preferably, x is a numerical value that satisfies $0.05 \le x \le 0.15$. Moreover, in Formula (1), more preferably, x is a numerical value that satisfies $0.05 \le x \le 0.2$, more preferably, is a numerical value that satisfies $0.1 \le x \le 0.2$. x in Formula (1) remains within such a range, whereby it becomes possible to maintain the garnet structure and to reduce the temperature quenching even if a part of Ca is replaced by Mg. Moreover, it also becomes possible to suppress the light emission peak wavelength from shifting largely to the short wavelength side.

As mentioned above, the phosphor of this embodiment contains $Ce^{3+}$ as an emission center. Therefore, an excitation spectrum of the phosphor has a broad excitation band generated by $Ce^{3+}$ absorption, and has an excitation peak wavelength within a range of 400 nm or more and less than 480 nm. Then, when x satisfies $0.03 \le x \le 0.3$ in Formula (1) mentioned above, the phosphor can have the light emission peak wavelength within a range of at least 587 nm or more and less than 596 nm. That is, as described later, the conventional phosphor having $Ce^{3+}$ as an emission center and $Lu_2CaMg_2(SiO_4)_3$ as a matrix has a light emission peak at around 594 nm. Then, even if a part of Ca in the $Lu_2CaMg_2(SiO_4)_3:Ce^{3+}$ phosphor is replaced by Mg as in this embodiment, the light emission peak wavelength can be controlled within the range of 587 nm or more and less than 596 nm. Therefore, the phosphor of this embodiment becomes capable of suppressing the light emission peak wavelength from shifting largely to the short wavelength side while reducing the temperature quenching.

$Lu_2CaMg_2(SiO_4)_3$ can form a solid solution by being solid-solved in a garnet compound different from this $Lu_2CaMg_2(SiO_4)_3$. Therefore, $Lu_2(Ca_{1-x}Mg_x)Mg_2(SiO_4)_3$ in which a part of Ca that composes $Lu_2CaMg_2(SiO_4)_3$ is replaced by Mg can also form a solid solution by being solid-solved in a garnet compound different from $Lu_2(Ca_{1-x}Mg_x)Mg_2(SiO_4)_3$. Preferably, this solid solution has a garnet structure, and this solid solution can become a garnet phosphor having novel fluorescence properties. Therefore, the phosphor of this embodiment may have, as a matrix, a solid solution composed by solid-solving $Lu_2(Ca_{1-x}Mg_x)Mg_2(SiO_4)_3$ and the garnet compound different from this $Lu_2(Ca_{1-x}Mg)Mg_2(SiO_4)_3$ in each other.

The garnet compound to be solid-solved in $Lu_2(Ca_{1-x}Mg_x)Mg_2(SiO_4)_3$ is preferably silicate or aluminate having a garnet structure, and more preferably, is a compound isomorphic to $Lu_2CaMg_2(SiO_4)_3$. As described above, $Lu_2(Ca_{1-x}Mg_x)Mg_2(SiO_4)_3$ and the garnet compound have chemical compositions similar to each other, and take the same crystal structure, whereby properties of the solid solution become similar to those of $Lu_2(Ca_{1-x}Mg_x)Mg_2(SiO_4)_3$. Therefore, it becomes possible to form the solid solution having the garnet structure.

The garnet compound to be solid-solved in $Lu_2(Ca_{1-x}Mg_x)Mg_2(SiO_4)_3$ in this embodiment can be represented by a general formula (2):

$$A_3B_2(CO_4)_3 \qquad (2)$$

In Formula (2), for example, A is at least one element selected from rare earth elements such as Y, Gd and Lu and alkaline earth metal elements such as Ca and Sr. B is at least one element selected from rare earth elements such as Sc and metallic elements such as Mg, Al, Ga, Zr and Hf. C is at least one element selected from metallic elements such as Li, Al, Si, V and Ge.

Specific examples of the garnet compound that can form the solid solution together with $Lu_2(Ca_{1-x}Mg)Mg_2(SiO_4)_3$ include $Y_3Al_2(AlO_4)_3$, $Gd_3Al_2(AlO_4)_3$, $Lu_3Al_2(AlO_4)_3$, $Ca_3Sc_2(SiO_4)_3$ and the like. Moreover, specific examples of this garnet compound can also include a compound in which $Y_3Al_2(AlO_4)_3$, $Gd_3Al_2(AlO_4)_3$, $Lu_3Al_2(AlO_4)_3$ and $Ca_3Sc_2(SiO_4)_3$ are solid-solved in one another.

It is possible to produce the phosphor of this embodiment by a known method. Specifically, like the conventional yttrium aluminum garnet (YAG), the phosphor can be synthesized by using a known solid phase reaction.

First, prepared are a rare earth oxide, an oxide of alkaline earth metal, a carbonate of alkaline earth metal, $SiO_2$ and others, which are universal raw material powders of ceramics. Next, the raw material powders are compounded so as to have a stoichiometric composition of a desired inorganic oxide or a composition close to the stoichiometric composition, and are mixed thoroughly using a mortar, a ball mill or the like. Thereafter, such a mixed raw material is baked by an electric furnace or the like using a baking vessel such as an alumina crucible, whereby the phosphor of this embodiment can be prepared. Note that, when the mixed raw material is baked, it is preferable to heat the mixed raw material at a baking temperature of 1300 to 1600° C. for several hours in the atmosphere or a weak reducing atmosphere.

Note that the phosphor of this embodiment can be used as that formed in a slurry form, a paste form, a sol form or a gel form by being approximately mixed with a solvent such as water, an organic solvent and a resin or with water glass.

As described above, the phosphor according to this embodiment is such a phosphor including: a matrix garnet compound having a garnet structure; and $Ce^{3+}$ as an emission center, which is contained in the matrix garnet compound. Then, in the matrix garnet compound, a part of Ca that composes the crystals of $Lu_2CaMg_2(SiO_4)_3$ is replaced by Mg. The phosphor as described above can reduce the temperature quenching greatly without largely shifting the light emission peak wavelength from the conventional $Lu_2CaMg_2(SiO_4)_3:Ce^{3+}$ phosphor. Then, the phosphor of this embodiment can radiate output light in which a ratio of the orange color is particularly high. Therefore, use of this phosphor makes it possible to obtain various light emitting devices excellent particularly in performance of emitting an orange light component.

[Light Emitting Device]

Next, a description will be given of the light emitting device according to this embodiment with reference to FIGS. 1 to 3. The light emitting device 10 according to this embodiment includes the phosphor mentioned above. Specifically, the light emitting device 10 according to this embodiment uses the above phosphor, and further includes a solid-state light emitting element as an excitation source 1, and the phosphor is excited by light radiated by the solid-state light emitting element.

Figure 1:
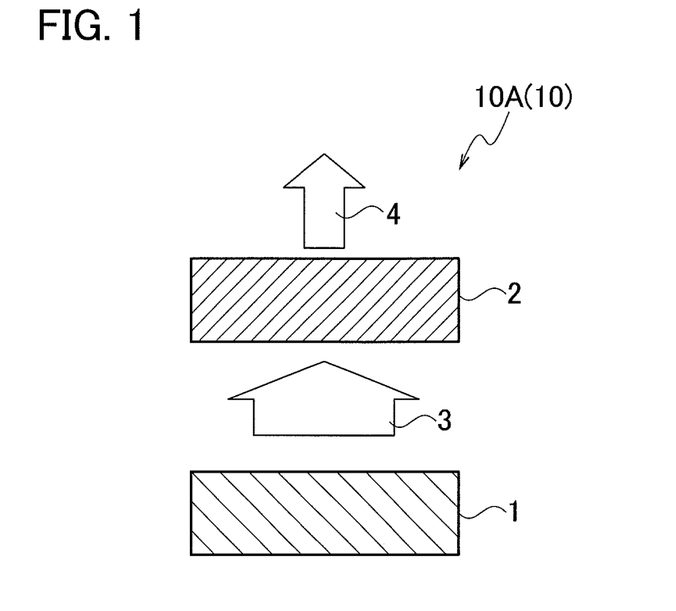
FIG. 1 is a diagram schematically showing a light emitting device according to a first embodiment.

FIG. 1 is a diagram schematically showing a light emitting device according to a first embodiment. FIG. 2 is a diagram schematically showing a light emitting device according to a second embodiment. FIG. 3 is a diagram showing a light emitting device according to a third embodiment. The light emitting device 10 according to each of these embodiments is used for a semiconductor light emitting device, an illumination light source, an illumination device, a liquid crystal panel attached with an LED backlight, an LED projector, a laser projector and the like.

First Embodiment

As shown in FIG. 1, a light emitting device 10A according to the first embodiment includes: a phosphor 2; and an excitation source 1 that excites the phosphor 2. The light emitting device 10A shown in FIG. 1 is a light emitting device having a structure in which a direction where the excitation source 1 irradiates the phosphor 2 with primary light 3 that is an excitation line or excitation light and a direction where the phosphor 2 radiates output light 4 are the same direction. The light emitting device 10A is preferably used for a white LED light source, a fluorescent lamp, an electron tube and the like.

The phosphor 2 is a phosphor containing the phosphor according to the above embodiment. Moreover, the phosphor 2 may be composed of plural types of phosphors. The phosphor 2 is usually molded into a plate shape, a film shape or the like to be then a wavelength conversion member.

The wavelength conversion member is obtained, for example, by dispersing and fixing powder of the phosphor 2 into a transparent resin, by mutually adhering the phosphor 2 by an inorganic binding agent, and so on. Moreover, the wavelength conversion member is usually formed on a surface of such a substrate or the like to be then a wavelength converter composed of the wavelength conversion member and the substrate. As the substrate to be used for the light emitting device 10A, a substrate having translucency is used. As the substrate having translucency, for example, a glass substrate, a translucent ceramic substrate and the like are used. As described above, the phosphor 2 in the light emitting device 10A becomes usually such a wavelength converter in which the wavelength conversion member containing the phosphor 2 is formed on the substrate having translucency.

The excitation source 1 is a light source that generates the primary light 3 for exciting the phosphor according to the above embodiment, which is contained in the phosphor 2. As the excitation source 1, for example, there is used a radiation device that radiates a particle beam such as an α ray, a β ray and an electron beam, or an electromagnetic wave such as a γ ray, an X ray, a vacuum ultraviolet ray, an ultraviolet ray and visible light. Here, as the visible light, short wavelength visible light such as purple light and blue light is preferable. If the excitation source 1 radiates the short wavelength visible light such as purple light and blue light, then it is easy to increase an output of the light emitting device.

As the excitation source 1, specifically, there are used varieties of radiation generating devices, electron beam radiating devices, discharge light generating devices, solid-state light emitting elements, solid-state light emitting devices, and the like. A typical excitation source 1 includes an electron gun, an X-ray tube, a rare gas discharge device, a mercury discharge device, a light emitting diode, a laser beam generating device including a semiconductor laser, an inorganic or organic electroluminescence element, and the like.

As shown in FIG. 1, in the light emitting device 10A, the excitation source 1 radiates the primary light 3 that is the excitation line or the excitation light, and further, the phosphor 2 excited by the primary light 3 radiates the output light 4. The output light 4 is radiated in the same direction as the primary light 3. The output light 4 radiated from the light emitting device 10A is used, for example, as illumination light and display light.

Second Embodiment

Figure 2:
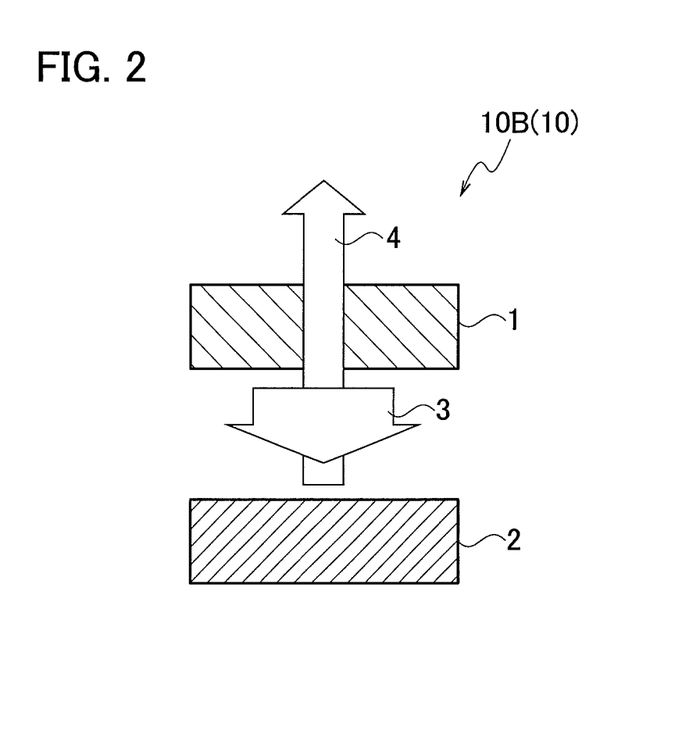
FIG. 2 is a diagram schematically showing a light emitting device according to a second embodiment.

As shown in FIG. 2, a light emitting device 10B according to the second embodiment includes: the phosphor 2; and the excitation source 1 that excites the phosphor 2. The light emitting device 10B shown in FIG. 2 is a light emitting device having a structure in which a direction where the excitation source 1 irradiates the phosphor 2 with the primary light 3 that is an excitation line or excitation light and a direction where the phosphor 2 radiates the output light 4 are opposite to each other. That is, in comparison with the light emitting device 10A shown in FIG. 1, the light emitting device 10B shown in FIG. 2 is different therefrom in disposition of the excitation source 1 and the phosphor 2 and in direction of the output light 4 with respect to the primary light 3. The light emitting device 10B is preferably used for a plasma display device, a light source device and a projector, each of which uses a phosphor wheel attached with a reflection plate, and the like.

In comparison with the light emitting device 10A according to the first embodiment, the light emitting device 10B according to the second embodiment is similar thereto except for the fact that the excitation source 1 and the phosphor 2 are disposed differently therefrom. Note that, strictly speaking, a member of the light emitting device 10B, which includes the phosphor 2, and a member of the light emitting device 10A, which includes the phosphor 2, are different from each other in type of the substrate to which the phosphor 2 is fixed. However, the phosphor 2 itself is the same between the light emitting device 10A and the light emitting device 10B. Therefore, the same reference numerals are assigned to the same members between the light emitting device 10B shown in FIG. 2 and the light emitting device 10A shown in FIG. 1, and descriptions of a structure and function thereof are omitted or simplified.

As shown in FIG. 2, the light emitting device 10B according to the second embodiment includes: the phosphor 2; and the excitation source 1 that excites the phosphor 2. These phosphor 2 and excitation source 1 are similar to the phosphor 2 and the excitation source 1, which are used in the light emitting device 10A according to the first embodiment, and accordingly, the description of the members thereof will be omitted.

In a similar way to the light emitting device 10A shown in FIG. 1, the phosphor 2 is usually molded into a plate shape, a film shape or the like to be then a wavelength conversion member. This wavelength conversion member is similar to that of the light emitting device 10A according to the first embodiment, and accordingly, a description thereof will be omitted. Moreover, the wavelength conversion member is usually formed on a surface of such a substrate or the like to be then a wavelength converter composed of the wavelength conversion member and the substrate. Unlike the light emitting device 10A according to the first embodiment, a substrate that does not have translucency is used as the substrate to be used for the light emitting device 10B. As the substrate that does not have translucency, for example, a metal substrate, a non-translucent ceramic substrate and the like are used. As described above, the phosphor 2 in the light emitting device 10B is usually such a wavelength converter in which the wavelength conversion member including the phosphor 2 is formed on the substrate that does not have translucency.

As shown in FIG. 2, in the light emitting device 10B, the excitation source 1 radiates the primary light 3 that is the excitation line or the excitation light, and further, the phosphor 2 excited by the primary light 3 radiates the output light 4. The output light 4 is radiated in the opposite direction to the primary light 3. The output light 4 radiated from the light emitting device 10B is used, for example, as illumination light and display light.

Third Embodiment

Figure 3:
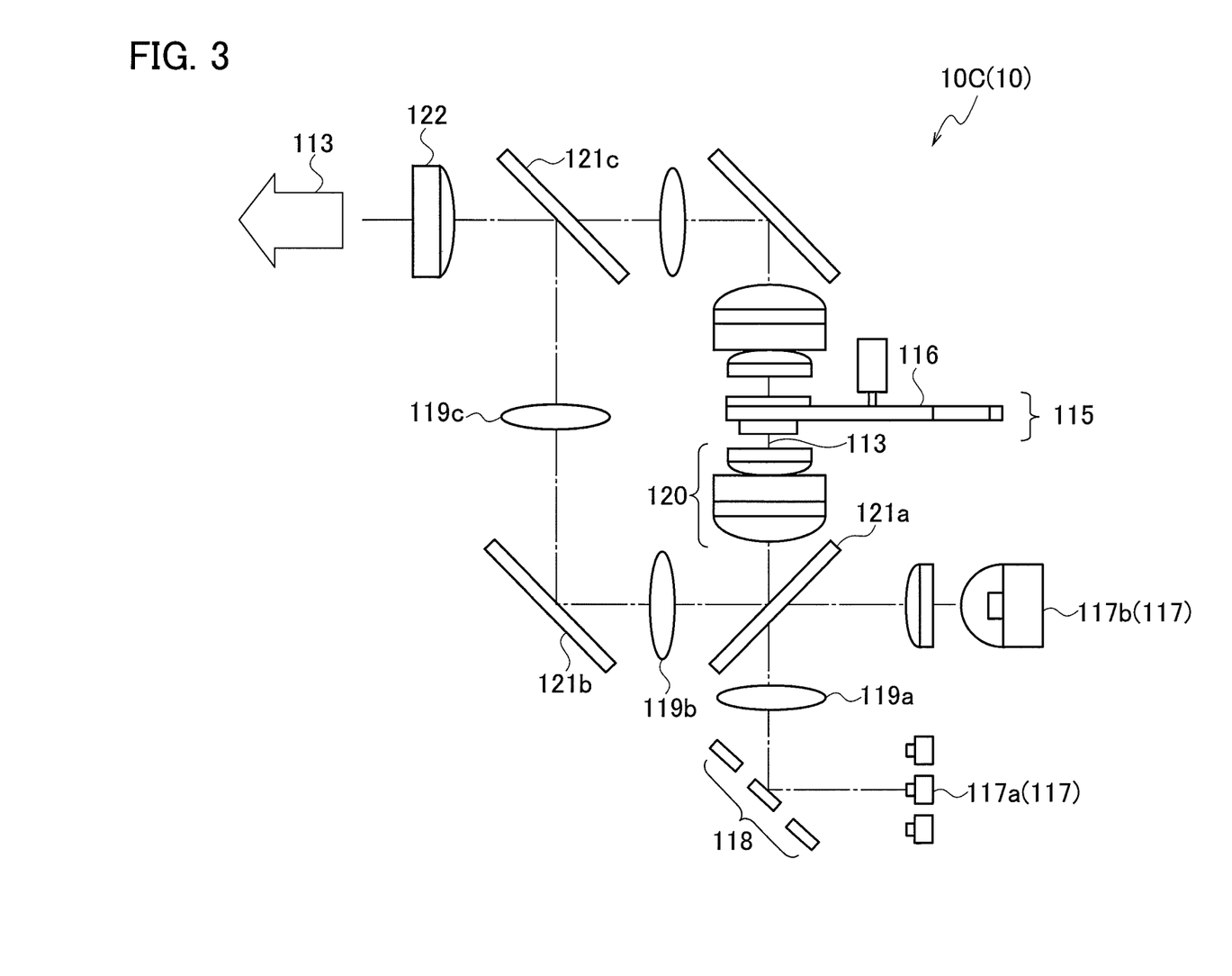
FIG. 3 is a diagram showing a light emitting device according to a third embodiment.

A light emitting device 10C shown in FIG. 3 includes: a fluorescent screen 115 as a wavelength converter including the phosphor according to the above embodiments and a substrate 116; and an excitation source 117 that excites the phosphor in the fluorescent screen 115. The light emitting device 10C is an example of a light source device for a projector.

The light emitting device 10C shown in FIG. 3 and the light emitting device 10A shown in FIG. 1 coincide with each other in terms of using the phosphor according to the above embodiments and including the excitation source 117. Therefore, in FIG. 3, the same reference numerals are assigned to the same constituents as those of the light emitting device 10A according to the first embodiment, and a description of configurations and functions thereof will be omitted or simplified.

In the light emitting device 10C according to the third embodiment, the phosphor according to the above embodiments becomes the fluorescent screen 115 as the wavelength converter including the phosphor and the substrate 116. The fluorescent screen 115 is a member containing the phosphor according to the above embodiments, and accordingly, is a member in which the phosphor 2 in the light emitting devices 10A and 10B according to the first and second embodiments is embodied.

The light emitting device 10C according to the third embodiment includes: the fluorescent screen 115 as the wavelength converter including the phosphor according to the above embodiments and the substrate 116; and a first light source 117a as the excitation source 117 that excites the phosphor 2 contained in the fluorescent screen 115.

As the first light source 117a that is the excitation source 117, for example, there is used a solid-state light emitting element that emits purple or blue light having a light emission peak in a wavelength region of 400 nm or more and less than 480 nm. As such a solid-state light emitting element, for example, a blue semiconductor laser diode is used. In the light emitting device 10C, at least a purple or blue light component 113 radiated by the first light source 117a is directly or indirectly applied to the phosphor provided in the fluorescent screen 115.

Plural pieces of the first light source 117a are provided. The purple or blue light radiated by the first light source 117a is reflected by a reflection mirror 118, is condensed by a first lens 119a, and thereafter, is applied to the phosphor in the fluorescent screen 115.

The blue green or green light component 113 radiated by the phosphor, the light component 113 having been reflected by a reflection surface of the fluorescent screen 115, is condensed by a condenser lens 120. The light component 113 is thereafter subjected to repetition of optical axis conversion and condensing by a first optical axis conversion mirror 121a, a second lens 119b, a second optical axis conversion mirror 121b, a third lens 119c and a third optical axis conversion mirror 121c. The light component 113 subjected to the repetition of the optical axis conversion and the condensing is made incident onto an exit lens 122, and thereafter, is emitted from the light emitting device 10C.

Note that the light emitting device 10C can also be made as a light emitting device 10 for multicolor display. In this case, for example, as the excitation source 117, a second light source 117b is further used, which radiates a light component of a color different from that of the first light source 117a.

As described above, in accordance with the light emitting device according to this embodiment, the light emitting device can be provided, in which the temperature quenching is reduced without largely shifting the light emission peak wavelength.

EXAMPLES

Hereinafter, this embodiment will be described more in detail by examples and comparative examples; however, this embodiment is not limited to these examples and comparative examples.

Phosphors according to the examples and the comparative examples were synthesized using a synthesis method that utilizes a solid phase reaction, and properties thereof were evaluated. Note that, in these examples and comparative example, the following compound powders were used as raw materials.

Lutetium oxide ($Lu_2O_3$): purity 3N, made by Shin-Etsu Chemical Co., Ltd.

Cerium oxide ($CeO_2$): purity 4N, made by Shin-Etsu Chemical Co., Ltd.

Calcium carbonate ($CaCO_3$): purity 2N5, made by Kanto Chemical Co., Inc.

Magnesium oxide (MgO): purity 4N, made by Kojundo Chemical Laboratory Co., Ltd.

Silicon dioxide ($SiO_2$): purity>3N, AEROSIL (registered trademark) 200 made by Nippon Aerosil Co., Ltd.

Examples 1 to 4

First, the respective raw materials were weighed at ratios shown in Table 1. Next, these raw materials were put into a glass beaker together with an appropriate amount of pure water, and were stirred sufficiently using a magnetic stirrer, and a mixed raw material in a slurry form was obtained. Then, the mixed raw material in the slurry form was transferred to a container, and was dried at 150° C. for 3 hours using a dryer. The mixed raw material already dried was pulverized using a mortar and a pestle, whereby a baked raw material was obtained.

TABLE 1

| | Blending amount (g) | | | | |
|---|---|---|---|---|---|
| | $Lu_2O_3$ | $CeO_2$ | $CaCO_3$ | MgO | $SiO_2$ |
| Example 1 | 3.8600 | 0.1033 | 0.9709 | 0.8183 | 1.8463 |
| Example 2 | 3.8600 | 0.1033 | 0.9008 | 0.8465 | 1.8463 |
| Example 3 | 3.8600 | 0.1033 | 0.8007 | 0.8868 | 1.8463 |
| Example 4 | 3.8600 | 0.1033 | 0.7006 | 0.9271 | 1.8463 |
| Comparative example 1 | 3.8600 | 0.1033 | 0.5005 | 1.0078 | 1.8463 |
| Comparative example 2 | 3.8600 | 0.1033 | 0.3003 | 1.0884 | 1.8463 |
| Comparative example 3 | 3.8600 | 0.1033 | 0.0000 | 1.2093 | 1.8463 |
| Comparative example 4 | 3.8600 | 0.1033 | 1.0009 | 0.8062 | 1.8463 |

Thereafter, the baked raw material was transferred to an alumina crucible attached with a cover, and was subjected to main baking for 2 hours in an atmosphere of 1400° C.

A baked product obtained as a result of the main baking was lightly disintegrated one more time using the mortar and the pestle, and an object to be subjected to reduction treatment was obtained. The object to be subjected to the reduction treatment was transferred to the alumina crucible, and was subjected to the reduction treatment for 1 hour in a reducing gas atmosphere of 1350° C. using a tubular atmosphere furnace. Note that, as such a reducing gas for forming the reducing gas atmosphere, a mixed gas of nitrogen of 96% by volume and hydrogen at 4% by volume was used, and a flow rate of the reducing gas was set to 100 cc/min. In this way, compounds of Examples 1 to 4 were obtained. Note that synthesis conditions such as the mixing method, the baking temperature, the reduction treatment temperature and the flow rate of the gas are not limited to those described above.

Comparative Examples 1 to 4

Compounds of Comparative examples 1 to 4 were obtained in a similar way to Examples 1 to 4 except that blending ratios of the respective raw materials were changed as shown in Table 1.

[Evaluation of Compounds of Examples 1 to 4 and Comparative Examples 1 to 4]

(Crystal Structure Analysis)

Figure 4:
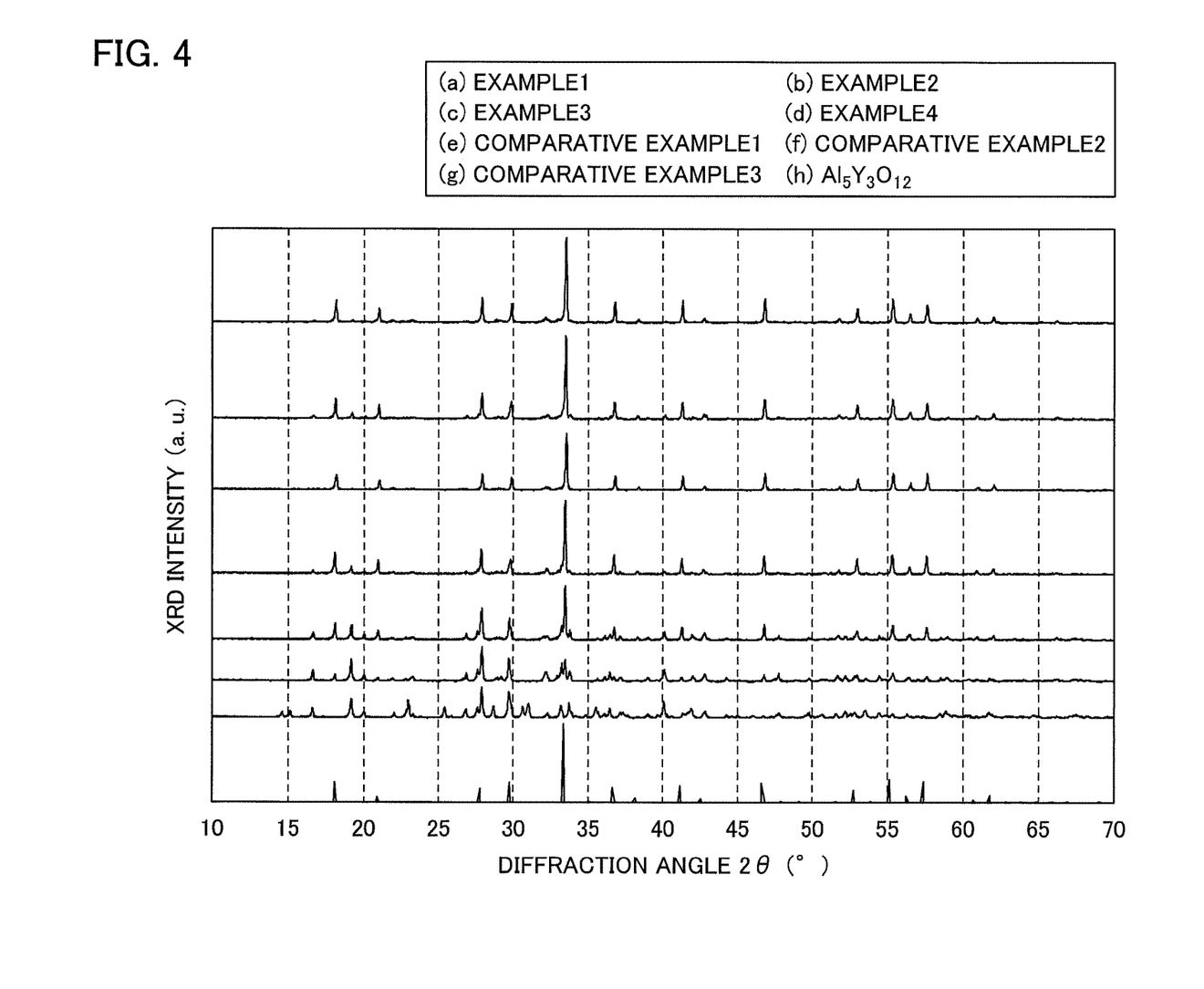
FIG. 4 is a graph showing X-ray diffraction (XRD) patterns of compounds of Examples 1 to 4 and Comparative examples 1 to 3 and of a known compound.

First, crystal structure analysis for the compounds of Examples 1 to 4 was carried out. FIG. 4 is a graph showing X-ray diffraction (XRD) patterns of the compounds of Examples 1 to 4 and of a known compound. Note that the XRD patterns were evaluated using an X-ray diffraction device (product name: MultiFlex, made by Rigaku Corporation).

In FIG. 4, the XRD pattern of Example 1 is shown as (a), the XRD pattern of Example 2 is shown as (b), the XRD pattern of Example 3 is shown as (c), and the XRD pattern of Example 4 is shown as (d). The XRD pattern of Comparative example 1 is shown as (e), the XRD pattern of Comparative example 2 is shown as (f), and the XRD pattern of Comparative example 3 is shown as (g). For reference, the pattern (PDF No. 33-0040) of $Al_5Y_3O_{12}$ registered in the Power Diffraction Files (PDF) is shown as (h).

When the respective patterns shown in FIG. 4 were compared with one another, the following facts were found. That is, it was found that the XRD patterns of Examples 1 to 4, which were represented by (a) to (d), substantially coincided with the pattern of $Al_5Y_3O_{12}$, which was shown by (h), in terms of shape features. Such consistency between the XRD patterns indicates that the compounds of Examples 1 to 4 are mainly composed of compounds having the same garnet structure as that of $Al_5Y_3O_{12}$. Then, when weighted ratios are considered, the compound of Example 1 can be said to be $(Lu_{0.97}Ce_{0.03})_2(Ca_{0.97}Mg_{0.03})Mg_2Si_3O_{12}$. Moreover, the compound of Example 2 can be said to be $(Lu_{0.97}Ce_{0.03})_2(Ca_{0.9}Mg_{0.1})Mg_2Si_3O_{12}$. The compound of Example 3 can be said to be $(Lu_{0.97}Ce_{0.03})_2(Ca_{0.8}Mg_{0.2})Mg_2Si_3O_{12}$. Furthermore, the compound of Example 4 can be said to be $(Lu_{0.97}Ce_{0.03})_2(Ca_{0.7}Mg_{0.3})Mg_2Si_3O_{12}$.

Moreover, when the respective patterns shown in FIG. 4 were compared with one another, the following facts were found. That is, it was found that the XRD patterns of Comparative examples 1 and 2, which were represented by (e) and (f), included many patterns which did not coincide with the pattern of $Al_5Y_3O_{12}$, which was shown by (h), in terms of shape features. Such partial inconsistency between the XRD patterns indicates that the compounds of Comparative examples 1 and 2 are composed by containing a high ratio of a compound different from the compound having the same garnet structure as that of $Al_5Y_3O_{12}$.

Moreover, when the respective patterns shown in FIG. 4 were compared with one another, the following facts were found. That is, it was found that the XRD pattern of Comparative example 3, which is represented by (g), did not coincide with the pattern of $Al_5Y_3O_{12}$, which is shown by (h), in terms of shape features. Such inconsistency between the XRD patterns indicates that the compound of Comparative example 3 is mainly composed of a compound different from the compound having the same garnet structure as that of $Al_5Y_3O_{12}$.

The above results of Examples 1 to 4 can be said to be data indicating that there is a compound represented by the general formula $Lu_2(Ca_{1-x}Mg_x)Mg_2(SiO_4)_3$ and satisfying $0.03 \leq x \leq 0.3$. Note that the compound having such a composition is a compound that has not been heretofore known and can be confirmed for the first time by experimental verification.

Figure 5:
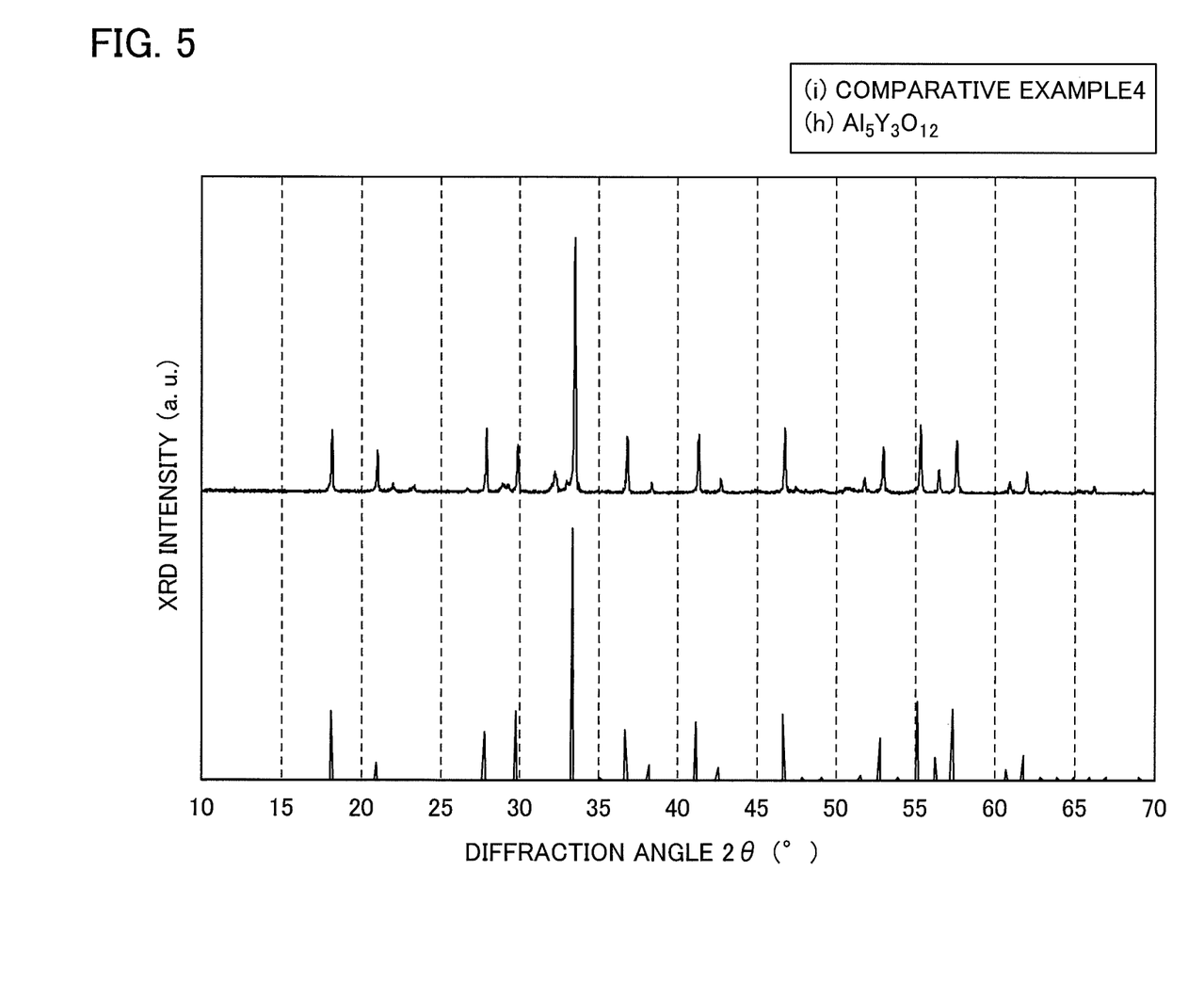
FIG. 5 is a graph showing X-ray diffraction (XRD) patterns of the compound of Comparative example 4 and of the known compound.

Next, in a similar way to Examples 1 to 4, crystal structure analysis for the compound of Comparative example 4 was carried out. FIG. 5 is a graph showing X-ray diffraction (XRD) patterns of the compound of Comparative example 4 and of the known compound. In FIG. 5, the XRD pattern of Comparative example 4 is shown as (i). Moreover, for reference, the pattern (PDF No. 33-0040) of $Al_5Y_3O_{12}$ registered in the Power Diffraction Files (PDF) is shown as (h).

When the respective patterns shown in FIG. 5 were compared with each other, the following facts were found. That is, it was found that the XRD pattern of Comparative example 4, which was represented by (i), substantially coincided with the pattern of $Al_5Y_3O_{12}$, which was shown by (h), in terms of shape features. Such consistency between the XRD patterns indicates that the compound of Comparative example 4 is mainly composed of such compounds having the same garnet structure as that of $Al_5Y_3O_{12}$. Then, when weighted ratios are considered, the compound of Comparative example 4 can be said to be $(Lu_{0.97}Ce_{0.03})_2CaMg_2Si_3O_{12}$.

(Blue Light Irradiation Test)

A blue light irradiation test that irradiates the compounds of Examples 1 to 4 and Comparative examples 1 to 4 with blue light (wavelength: 450 nm) was carried out.

When the compound of Example 1 was irradiated with the blue light (wavelength: 450 nm), intense orange fluorescence was visually observed. That is, the compound of Example 1 was a phosphor that radiated orange light.

When the compound of Example 2 was irradiated with the blue light (wavelength: 450 nm), intense orange fluorescence was visually observed. That is, the compound of Example 2 was a phosphor that radiated orange light.

When the compound of Example 3 was irradiated with the blue light (wavelength: 450 nm), intense orange fluorescence was visually observed. That is, the compound of Example 3 was a phosphor that radiated orange light.

When the compound of Example 4 was irradiated with the blue light (wavelength: 450 nm), intense orange fluorescence was visually observed. That is, the compound of Example 4 was a phosphor that radiated orange light.

When the compound of Comparative example 1 was irradiated with the blue light (wavelength: 450 nm), weak orange fluorescence was visually observed. That is, the compound of Comparative example 1 was a phosphor that radiated orange light.

When the compound of Comparative example 2 was irradiated with the blue light (wavelength: 450 nm), weak orange fluorescence was visually observed. That is, the compound of Comparative example 2 was a phosphor that radiated orange light.

When the compound of Comparative example 3 was irradiated with the blue light (wavelength: 450 nm), no fluorescence was visually observed. That is, the compound of Comparative example 3 was a compound that did not exhibit fluorescence under irradiation of the blue light.

When the compound of Comparative example 4 was irradiated with the blue light (wavelength: 450 nm), intense orange fluorescence was visually observed. That is, the compound of Comparative example 4 was a phosphor that radiated orange light.

(Measurement of Light Emission Spectrum)

Light emission spectra were measured for the compounds of Examples 1 to 4 and Comparative example 4. The light emission spectra were measured using a quantum efficiency measuring system (product name: QE-1100 made by Otsuka Electronics Co., Ltd.).

Figure 6:
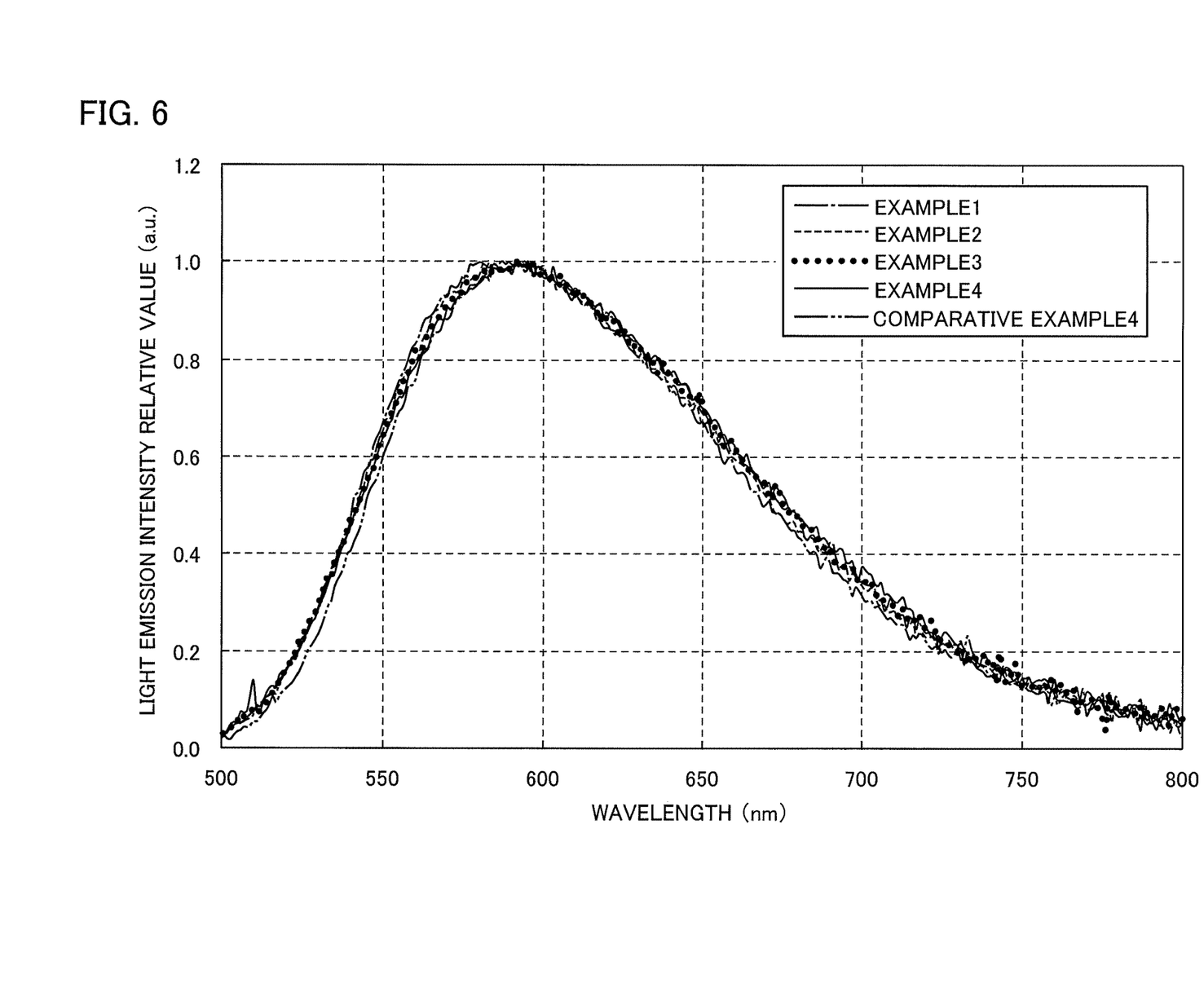
FIG. 6 is a graph showing light emission spectra of the compounds of Examples 1 to 4 and Comparative example 4.

FIG. 6 is a graph showing the light emission spectra of the compounds of Examples 1 to 4 and Comparative example 4. Note that the excitation peak wavelength was set to 450 nm. Moreover, all of the light emission spectra in FIG. 6 are standardized and shown while taking peak values thereof as 1.

From FIG. 6, it was found that the light emission spectra of the phosphors in Examples 1 to 4 had slightly different light emission peak wavelengths from that of the light emission spectrum of the phosphor in Comparative example 4. Specifically, it was found that, while the light emission spectrum of the phosphor in Comparative example 4 had the light emission peak at 594 nm, the light emission spectra of the phosphors in Examples 1 to 4 had the light emission peaks respectively at 587 nm, 592 nm, 591 nm and 595 nm.

Moreover, from FIG. 6, it was found that such phosphors represented by the general formula $Lu_2(Ca_{1-x}Mg_x)Mg_2(SiO_4)_3$ and satisfying $0.03 \leq x \leq 0.3$ had the light emission peak wavelengths exceeding 586 nm. Furthermore, from FIG. 6, it was found that, for the phosphors represented by the general formula $Lu_2(Ca_{1-x}Mg_x)Mg_2(SiO_4)_3$ and satisfying 0.03≤x≤0.3, it was possible to control the light emission peaks thereof within the range of at least 587 nm or more and less than 596 nm.

From these results, it was found that, unexpectedly, the phosphors represented by the general formula $Lu_2(Ca_{1-x}Mg_x)Mg_2(SiO_4)_3$ and satisfying 0.03≤x≤0.3 were phosphors in each of which shift of the light emission peak wavelength was small even if a part of Ca was replaced by Mg.

Furthermore, from FIG. 6, the light emission spectra of the phosphors in Examples 1 to 4 and Comparative example 4 have shapes mainly composed of the light emission spectra derived from the electron energy transition of $Ce^{3+}$. Moreover, the light emission spectra of the phosphors in Examples 1 to 4 and Comparative example 4 include the spectrum component derived from the electron energy transition of $Ce^{3+}$.

(Evaluation of Temperature Quenching)

Temperature quenching was evaluated for the phosphors of Examples 1 to 3 and Comparative example 4. The temperature quenching was evaluated using a quantum efficiency measuring system (product name: QE-1100 made by Otsuka Electronics Co., Ltd.) provided with an instant multi-photometry system (product name: MCPD-9800 made by Otsuka Electronics Co., Ltd.). Specifically, using a heating mechanism provided in the quantum efficiency measuring system, the phosphors of Examples 1 to 3 and Comparative example 4 were heated from 30° C. to 200° C. in increments of 20° C. Then, internal quantum efficiency of each of the phosphors was measured every time when the phosphor was heated in increments of 20° C. Note that the excitation peak wavelength was set to 450 nm.

A ratio of the internal quantum efficiency when a temperature of the phosphor was 150° C. with respect to the internal quantum efficiency when the temperature of the phosphor was 30° C. was defined as an internal quantum efficiency maintenance factor (%), and was used as a measure of the temperature quenching of the phosphor. The internal quantum efficiency maintenance factor serves as an index for evaluating the temperature quenching of the phosphor. The internal quantum efficiency maintenance factor and the temperature quenching of the phosphor are in a relationship where the temperature quenching of the phosphor becomes smaller as the internal quantum efficiency maintenance factor of the phosphor is higher.

Figure 7:
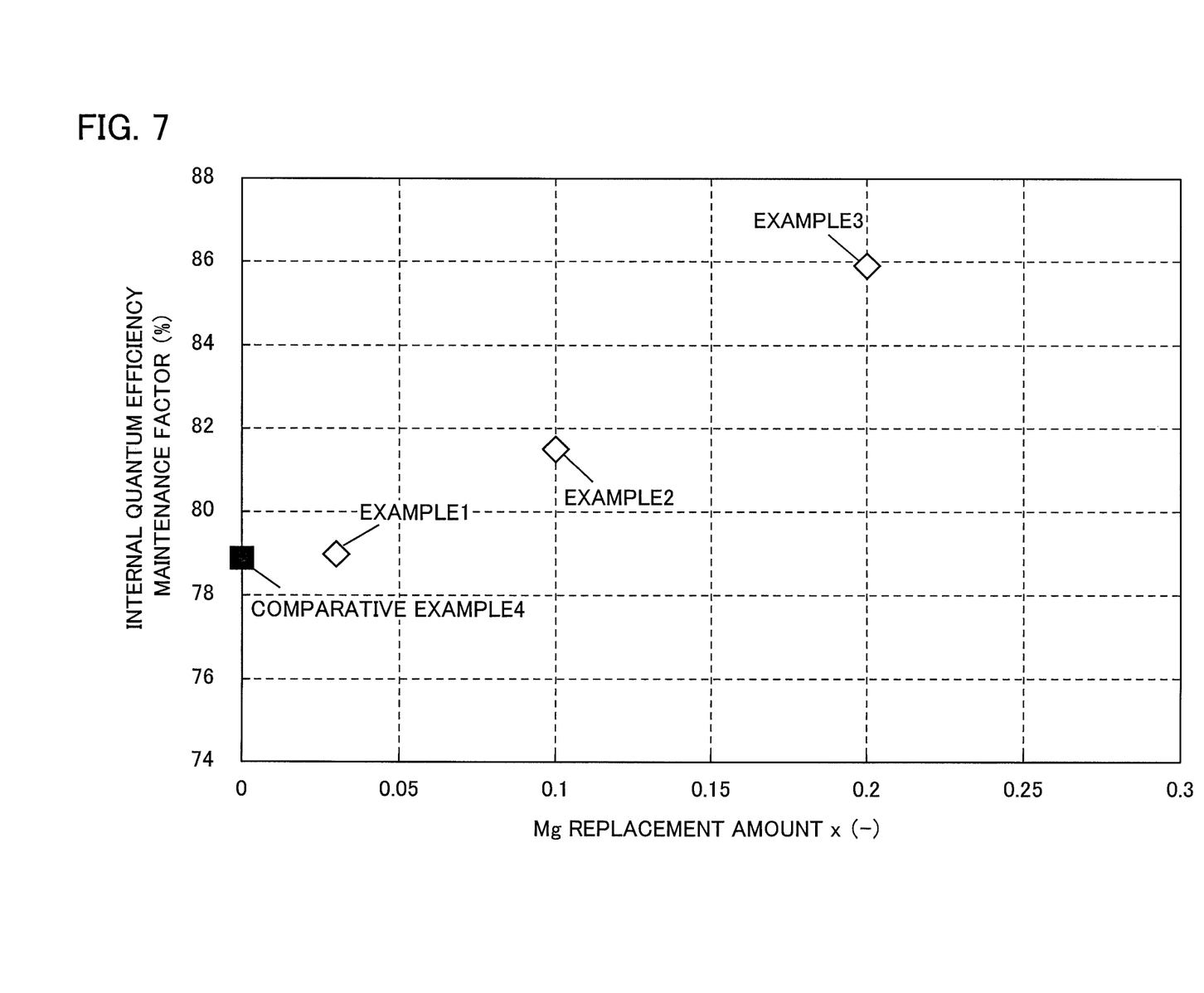
FIG. 7 is a graph showing relationships between Mg replacement amounts (x) and internal quantum efficiency maintenance factors in phosphors of Examples 1 to 3 and Comparative example 4.

FIG. 7 is a graph showing relationships between Mg replacement amounts (x) and the internal quantum efficiency maintenance factors in the phosphors of Examples 1 to 3 and Comparative example 4. From FIG. 7, it was found that the internal quantum efficiency maintenance factors of the phosphors in Examples 1 to 3 were higher than the internal quantum efficiency maintenance factors of the phosphor in Comparative example 4. In general, in the $Ce^{3+}$-activated garnet phosphor, the light emission peak wavelength and the internal quantum efficiency maintenance factor tend to correlate with each other, and the improvement of the internal quantum efficiency maintenance factor (the reduction of the temperature quenching) in the conventional technology involves a large shift of the light emission peak wavelength to the short wavelength side. However, unexpectedly, such a correlation was not substantially recognized in the phosphor of this embodiment.

As described above, from FIG. 6 and FIG. 7, it was found that, in comparison with $(Lu_{0.97}Ce_{0.03})_2CaMg_2Si_3O_{12}$ in Comparative example 4, the phosphors in Examples 1 to 3 were phosphors in each of which the temperature quenching was reduced without largely shifting the light emission peak wavelength.

Moreover, it was found that, when x satisfied 0.03≤x≤0.2, then in comparison with $(Lu_{0.97}Ce_{0.03})_2CaMg_2Si_3O_{12}$, there were obtained such phosphors in each of which the temperature quenching was reduced without largely shifting the light emission peak wavelength.

(Evaluation of Internal Quantum Efficiency)

The internal quantum efficiencies were evaluated for the phosphors of Examples 1 to 4 and Comparative example 4. The internal quantum efficiencies were evaluated using the quantum efficiency measuring system (product name: QE-1100 made by Otsuka Electronics Co., Ltd.). Note that the excitation peak wavelength was set to 450 nm.

Figure 8:
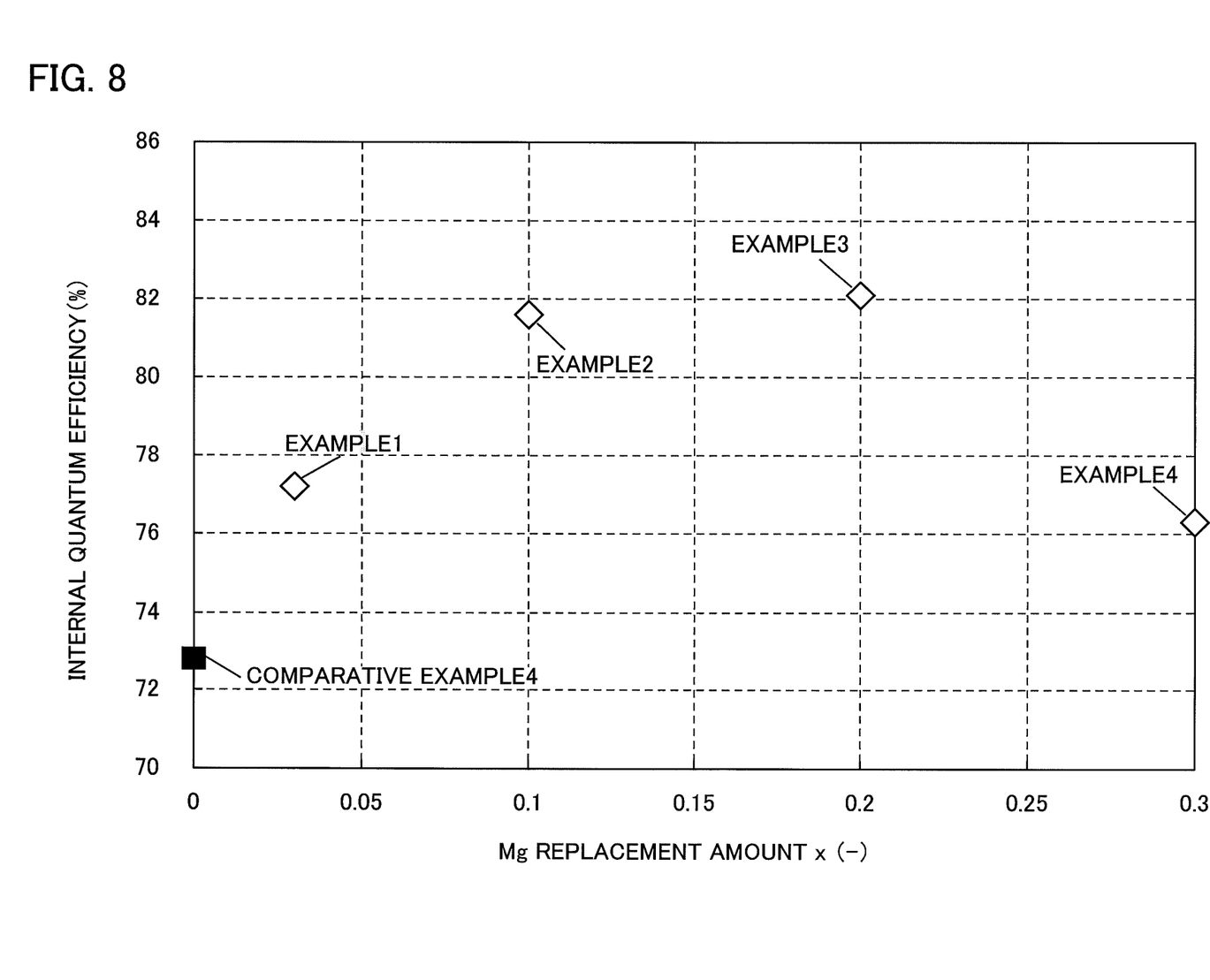
FIG. 8 is a graph showing relationships between Mg replacement amounts (x) and internal quantum efficiencies in the phosphors of Examples 1 to 4 and Comparative example 4.

FIG. 8 is a graph showing relationships between Mg replacement amounts (x) and the internal quantum efficiencies in the phosphors of Examples 1 to 4 and Comparative example 4. From FIG. 8, it was found that the internal quantum efficiencies of the phosphors in Examples 1 to 4 were higher than the internal quantum efficiency of the phosphor in Comparative example 4. In general, the internal quantum efficiency maintenance factors and the internal quantum efficiencies substantially correlate with each other, and a phosphor having high internal quantum efficiency can be regarded as a phosphor in which the internal quantum efficiency maintenance factor is improved (that is, the temperature quenching is reduced).

From these results, it was found that, in comparison with $(Lu_{0.97}Ce_{0.03})_2CaMg_2Si_3O_{12}$ in Comparative example 4, the phosphors in Examples 1 to 4 were such phosphors in which the internal quantum efficiencies were improved without largely shifting the light emission peak wavelengths. That is, it was found that, in comparison with the conventional phosphor, the phosphors represented by the general formula $Lu_2(Ca_{1-x}Mg_x)Mg_2(SiO_4)_3$ and satisfying 0.03≤x≤0.3 were the phosphors in which the internal quantum efficiencies were improved without largely shifting the light emission peak wavelengths.

Moreover, it is found that, when x satisfies 0.03≤x≤0.2, then in comparison with $(Lu_{0.97}Ce_{0.03})_2CaMg_2Si_3O_{12}$, the internal quantum efficiencies can be improved more without largely shifting the light emission peak wavelengths.

Then, it is found that, when x satisfies 0.1≤x≤0.2, then in comparison with $(Lu_{0.97}Ce_{0.03})_2CaMg_2Si_3O_{12}$, the internal quantum efficiencies can be improved more without largely shifting the light emission peak wavelengths.

From the examples described above, it was found that the phosphor according to this embodiment was capable of adopting varieties of modification examples, solid solutions and the like in terms of the composition and the type of the emission center.

Although the contents of this embodiment have been described above in accordance with the examples, it is obvious to those skilled in the art that this embodiment is not limited to the description of these and that various modifications and improvements are possible.

The entire contents of Japanese Patent Application No. 2016-166944 (filed on: Aug. 29, 2016) are incorporated herein by reference.

INDUSTRIAL APPLICABILITY

In accordance with the present invention, it is possible to provide the garnet phosphor in which the temperature quenching is reduced without largely shifting the light emission peak wavelength from that of the $Lu_2CaMg_2(SiO_4)_3:Ce^{3+}$ phosphor, and to provide the light emitting device using the phosphor.

REFERENCE SIGNS LIST

2 Phosphor
10 Light emitting device

The invention claimed is:

1. A phosphor comprising: a matrix garnet compound having a garnet structure; and $Ce^{3+}$ as an emission center, which is contained in the matrix garnet compound,
wherein, in the matrix garnet compound, a part of Ca that composes a crystal of $Lu_2CaMg_2(SiO_4)_3$ is replaced by Mg.

2. The phosphor according to claim 1, wherein the matrix garnet compound is represented by a general formula (1):

$$Lu_2(Ca_{1-x}Mg_x)Mg_2(SiO_4)_3 \quad (1)$$

where x is a numerical value that satisfies $0.03 \leq x \leq 0.2$.

3. A light emitting device comprising: the phosphor according to claim 1.

4. The light emitting device according to claim 3, further comprising a solid-state light emitting element,
wherein the phosphor is excited by light radiated by the solid-state light emitting element.

* * * * *